(12) United States Patent
Huang

(10) Patent No.: US 7,985,662 B2
(45) Date of Patent: Jul. 26, 2011

(54) METHOD FOR MANUFACTURING DIES FORMED WITH A DIELECTRIC LAYER

(75) Inventor: Yu-Chieh Huang, Hsinchu (TW)

(73) Assignee: Powertech Technology Inc., Hsinchu (TW)

( * ) Notice: Subject to any disclaimer, the term of this patent is extended or adjusted under 35 U.S.C. 154(b) by 192 days.

(21) Appl. No.: 12/423,486

(22) Filed: Apr. 14, 2009

(65) Prior Publication Data

US 2010/0261337 A1 Oct. 14, 2010

(51) Int. Cl.
*H01L 21/00* (2006.01)
(52) U.S. Cl. .................... 438/464; 257/E21.237
(58) Field of Classification Search .......... 438/33, 438/68, 113, 114, 118, 458, 460, 464; 257/E21.505, 257/E21.237; 156/314, 306.9
See application file for complete search history.

(56) References Cited

U.S. PATENT DOCUMENTS

| | | | |
|---|---|---|---|
| 5,960,260 A * | 9/1999 | Umehara et al. | 438/118 |
| 7,101,620 B1 * | 9/2006 | Poddar et al. | 428/354 |
| 7,700,458 B2 * | 4/2010 | Do et al. | 438/464 |
| 7,772,691 B2 * | 8/2010 | Lee et al. | 257/706 |
| 2002/0001688 A1 * | 1/2002 | Ueda et al. | 428/35.7 |
| 2007/0015342 A1 * | 1/2007 | Abe | 438/458 |
| 2007/0290369 A1 * | 12/2007 | Hasegawa et al. | 257/783 |
| 2009/0028671 A1 * | 1/2009 | Jin et al. | 414/217 |
| 2009/0186216 A1 * | 7/2009 | Inada et al. | 428/337 |

* cited by examiner

*Primary Examiner* — Matthew Landau
*Assistant Examiner* — Latanya N Crawford
(74) *Attorney, Agent, or Firm* — Muncy, Geissler, Olds & Lowe, PLLC

(57) ABSTRACT

A method of manufacturing dies formed with a dielectric layer is revealed. A liquid dielectric layer is formed on the dicing tape. The liquid dielectric layer is heated to be sticky. Then, a wafer is attached to the dielectric layer on the dicing tape. The wafer is diced into a plurality of dies on the dicing tape. The dies with attached portions of the dielectric layer are picked up to be peeled and separated from the dicing tape. The implementation of the dicing tape can be expanded to resolve various issues such as wafer contaminations, wafer warpage due to multiple heating and mismatching of thermal expansion coefficients, and wafer singulation problems due to alignment difficulties. The wafer handling steps can further be reduced to increase processing yield and to enhance easy and better processing.

10 Claims, 11 Drawing Sheets

METHOD FOR MANUFACTURING DIES FORMED WITH A DIELECTRIC LAYER

FIELD OF THE INVENTION

The present invention relates to a method of manufacturing semiconductor devices by wafer dicing, and more particularly to a method of manufacturing dies formed with a dielectric layer.

BACKGROUND OF THE INVENTION

In semiconductor industries, the manufacture of semiconductor devices primarily divides into three stages: wafer fabrication, chip formation, and chip assembly. During wafer fabrication and chip formation processes, a dielectric layer is directly formed on a wafer for die attachment or for wafer-level packaging where the dielectric layer can be B-stage films, solid films or epoxy liquid pastes. However, solid films are more expensive. Therefore, it is more common to dispose liquid pastes on a wafer such as stencil printing on the back surface of a wafer, but the wafer is easily contaminated.

FIG. 1 is the block diagram of a conventional process flow for manufacturing dies with a dielectric layer. Step 1 is to provide a wafer. Step 2 is to attach a protecting tape to the active surface of the wafer to avoid contamination of liquid dielectric materials on the active surface in sequential steps. Step 3 is to turn the wafer upside down with the back surface facing upward. Step 4 is to form a dielectric layer on the back surface of the wafer by stencil printing or any known liquid disposition methods where the cover area of the dielectric layer should be smaller than the one of the back surface of the wafer to avoid liquid bleeding to the sides of the wafer or even to the protecting tape. Step 5 is to thermally cure the dielectric layer on the wafer to reach a certain degree of dryness and curing to avoid serious bleeding in Step 6. In step 5, since the dielectric layer is thermally cured, dimension shrinkage due to curing is unavoidable. Moreover, the wafer is also under heating at the same time, and there is a thermal mismatching issue due to different thermal expansion coefficients and dimensions between the wafer and the dielectric layer. Then, step 6 is to turn the back surface of the wafer downward to attach to a dicing tape so that the dielectric layer is attached to the dicing tape by the adhesion of the dicing tape. Afterward, step 7 is to remove the protecting tape to expose the active surface of the wafer. Then, step 8 is to dice the wafer into a plurality of individual dies. Finally, step 9 is to pick up the dies from the dicing tape. Therefore, the wafer with the dielectric layer will experience multiple heating steps leading to serious wafer warpage issues due to mismatching of thermal expansion coefficients and dimensions, more the worse, the curing shrinkage of dielectric layer causing wafer handling difficulties in the following processes. Furthermore, since the wafer has to go through multiple turning steps, the risk of lower yields and higher cost is relatively increased. Once the back surface of the wafer is not turned upside down in step 6 and the protecting tape is not removed to expose the active surface in step 7, singulation in step 8 has to be done from the back surface of a wafer where scribe line alignment for wafer dicing processes becomes difficult.

SUMMARY OF THE INVENTION

The main purpose of the present invention is to provide a method of manufacturing dies formed with a dielectric layer to resolve contamination of the dielectric layer on the active surface of a wafer as well as the wafer warpage due to multiple heating steps exerted on a wafer during formation of dielectric layer and mismatching of thermal expansion coefficients and dimensions. Moreover, the wafer turning steps are decreased to achieve higher yields with lower cost.

The second purpose of the present invention is to provide a method of manufacturing dies formed with a dielectric layer and to resolve wafer damages due to turning wafers for wafer dicing processes as well as alignment issues due to wafer dicing from the back surface of a wafer, thereby leading to easy and better processing.

According to the present invention, a method of manufacturing dies formed with a dielectric layer is revealed, primarily comprising the following steps: Firstly, a dicing tape is provided. A liquid dielectric layer is formed on the dicing tape. The liquid dielectric layer is heated to be sticky, i.e., in a B-staged or partially cured state. A wafer is attached to the dielectric layer on the dicing tape. The wafer and the dielectric layer are diced to form a plurality of dies each having a certain portion of the dielectric layer attached. The dies are picked up with the corresponding attached portions of the dielectric layer are peeled and separated from the dicing tape.

The method of manufacturing dies formed with a dielectric layer according to the present invention has the following advantages and functions:

1. Through the sequence of processing steps by preforming the dielectric layer on the dicing tape and then attaching the wafer as a technical means, dicing tape can commonly implement in formation of the dielectric layer as well as in the wafer dicing step. This resolves the contamination of dielectric layer on the active surface of the wafer as well as the wafer warpage due to multiple heating steps exerted on the wafer during formation of the dielectric layer and mismatching of thermal expansion coefficients and dimensions. Moreover, the wafer turnover time is also decreased to achieve higher yields with lower cost.

2. Through the sequence of processing steps by preforming the dielectric layer on the dicing tape and then attaching the wafer a technical means, dicing tape can commonly implement in the formation step of the dielectric layer as well as in the wafer dicing step to expose the active surface of the wafer. This resolves wafer damages due to turning wafers for wafer dicing processes as well as alignment issues due to the wafer being diced from the back surface of a wafer, leading to easy and better processing.

3. Through the assembly of a spin-coating stage and positioning ring and the sequence of processing steps as a technical means, the excess bleeding of the dielectric layer can be accommodated by the annular groove on the spin-coating stage to avoid bleeding contamination of the dielectric layer to the attaching area of the positioning ring.

4. Through the dielectric layer having the characteristic of multiple-curing stages and being transferred from the dicing tape to the wafer as a technical means, the preformed dielectric layer can replace the conventional adhesive film as die-attaching paste or encapsulant for wafer level packaging to reduce the cost.

DETAILED DESCRIPTION OF THE INVENTION

With reference to the attached drawings, the present invention is described by means of the embodiment(s) below where the attached drawings are simplified for illustration purposes only to illustrate the structures or methods of the present invention by describing the relationships between the components and assembly in the present invention. Therefore, the components shown in the figures are not expressed with the actual numbers, actual shapes, actual dimensions, nor with the actual ratio. Some of the dimensions or dimension ratios have been enlarged or simplified to provide a better illustration. The actual numbers, actual shapes, or actual dimension ratios can be selectively designed and disposed and the detail component layouts may be more complicated.

Figure 1:
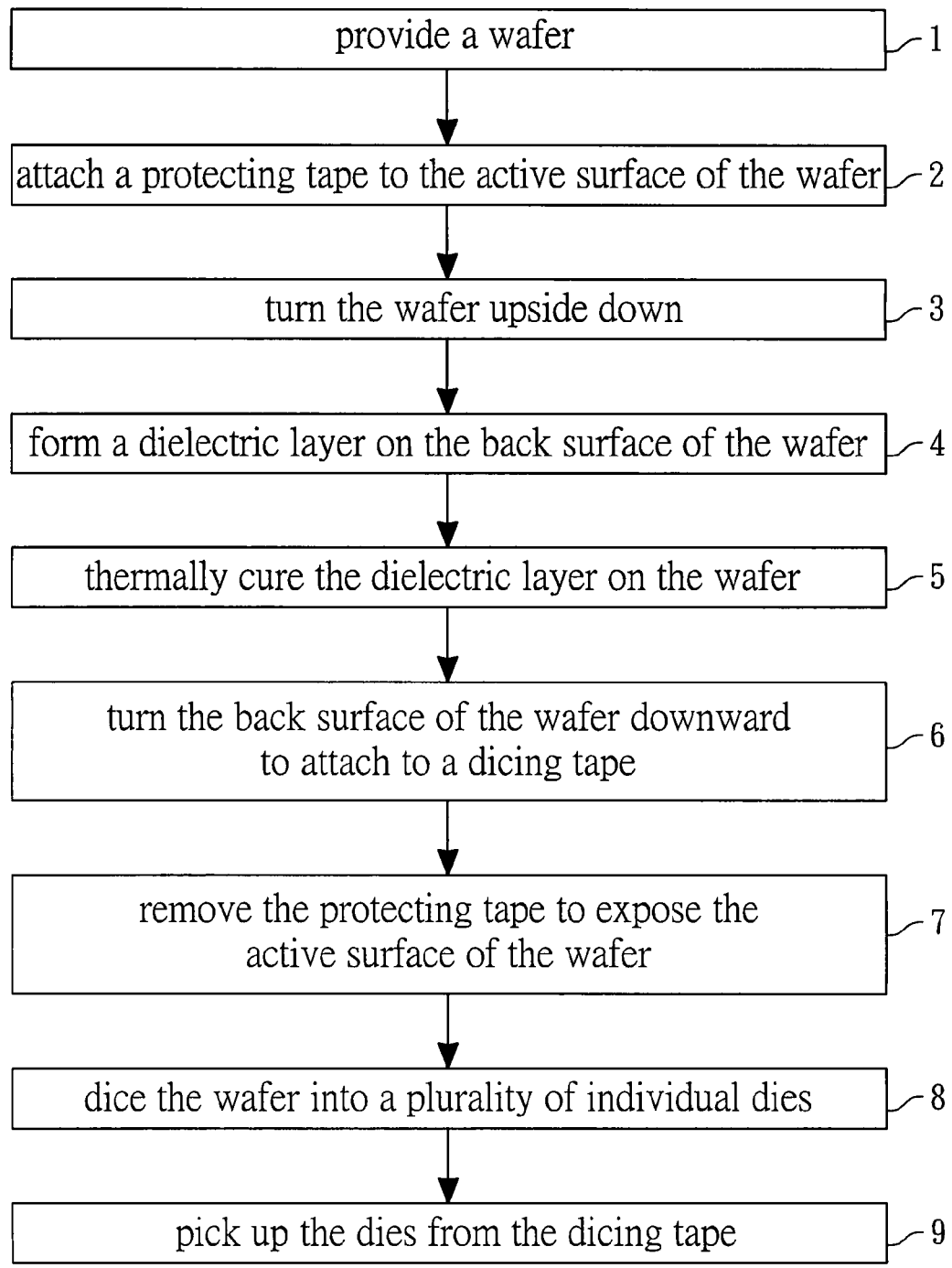
FIG. 1 is a process flow block diagram for a conventional method of manufacturing dies formed with a dielectric layer.
Figure 2:
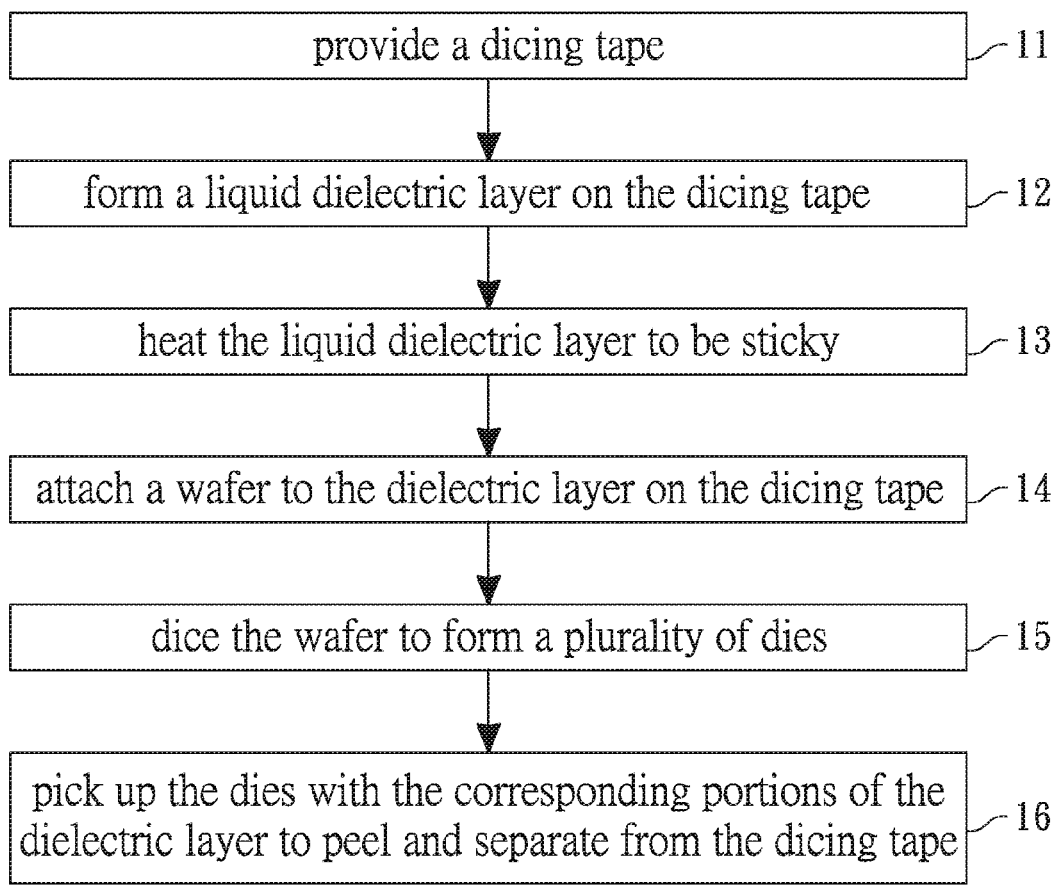
FIG. 2 is a process flow block diagram for a method of manufacturing dies formed with a dielectric layer according to the first embodiment of the present invention.

According to the first embodiment of the present invention, a method of manufacturing dies formed with a dielectric layer is illustrated in FIG. 2 for process flow block diagram and FIGS. 3A to 3G for the cross-sectional views of components in processing steps during the method. The method of manufacturing dies formed with a dielectric layer primarily comprises the steps as shown in FIG. 2 where the detailed description of each step is described as follows.

Figure 3A:
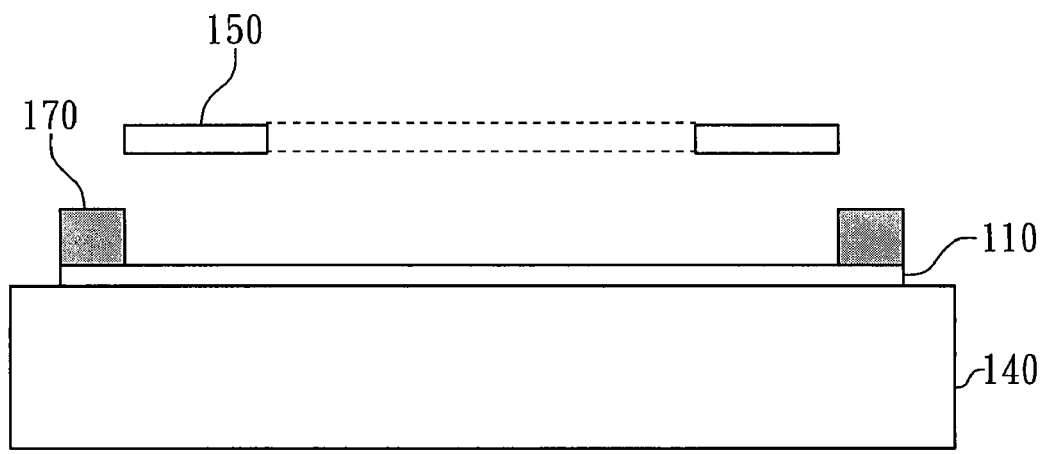
FIGS. 3A to 3G are the cross-sectional views of components in processing steps during the method according to the first embodiment of the present invention.
Figure 3B:
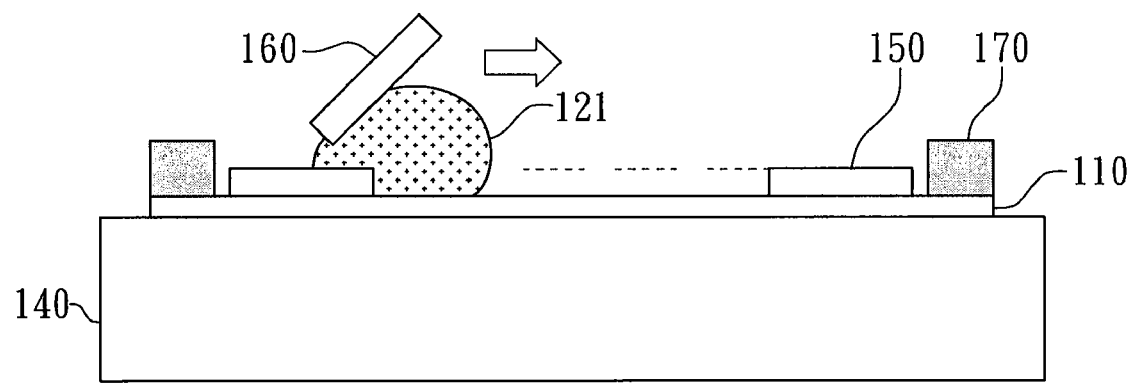
Figure 3C:
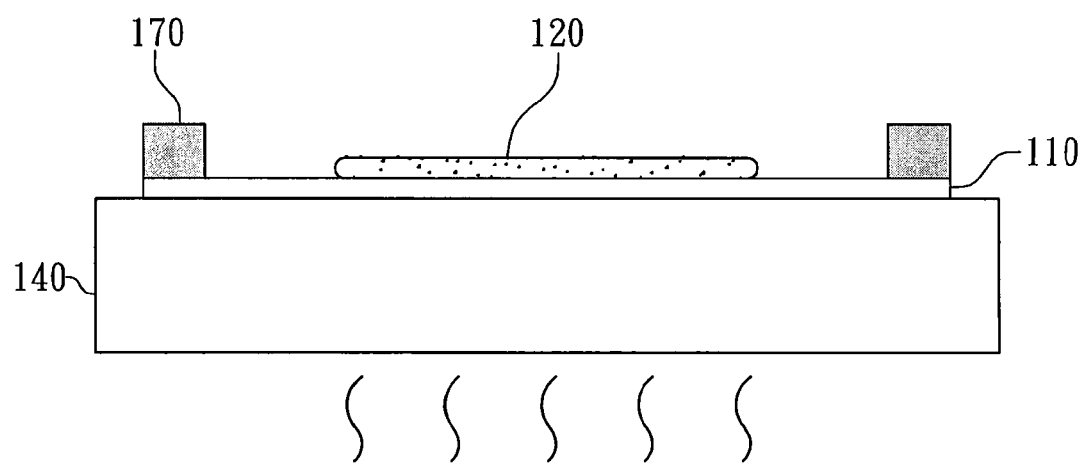

Firstly, step 11 is performed to provide a dicing tape 110, as shown in FIG. 3A. The dicing tape 110 can be a UV blue tape or other photosensitive adhesive tapes to firmly hold the dies during wafer singulation processes without separation, where the adhesion of the dicing tape 100 can be reduced or eliminated by radiating UV light in the following processes. The dicing tape 110 is attached to a stage 140 in order to keep the dielectric layer 120 horizontal (as shown in FIG. 3C). The stage 140 can be a hot plate to heat the dielectric layer 120 during the wafer attaching step which will be explained in detail in step 14. Preferably, a positioning ring 170 is attached to the peripheries of the dicing tape 110 to support the dicing tape 110 in step 11, so that the wafer 130 is not damaged or deformed during processing. Normally, the positioning ring 170 can be made of metal such as stainless steel, aluminum, iron, etc. having an opening larger than the attached wafer 130 (as shown in FIG. 3E).

Then, step 12 is performed to form a liquid dielectric layer 120 on the dicing tape 110, as shown in FIG. 3C, where the dielectric layer 120 has the characteristic of multiple-curing stages. In the present embodiment, the dielectric layer 120 can be formed on the dicing tape 110 by stencil printing. For example, a stencil 150 is placed on top of the dicing tape 110 as shown in FIG. 3A, and then a scraper 160 scrapes a liquid dielectric material 121 into the stencil 150 as shown in FIG. 3B. After removing the stencil 150 and the scraper 160, the dielectric layer 120 transformed from the liquid dielectric material 121 is formed on the dicing tape 110 as shown in FIG. 3C. The liquid dielectric layer 120 is formed in a printed pattern not smaller than the attaching area of the wafer 130 (as shown in FIG. 3E) to allow larger alignment tolerance for easy wafer attachment to enhance the processing steps.

Next, step 13 is performed to heat the liquid dielectric layer 120 to be sticky as shown in FIG. 3C again. In the present embodiment, the liquid dielectric layer 120 is heated by the hot plate 140 where the dielectric layer 120 becomes B-staged or in a partially cured state. Therefore, a conventional wafer heating step is eliminated; moreover, the shrinkage of the dielectric layer 120 due to curing will have no effect on the wafer 130.

Figure 3D:
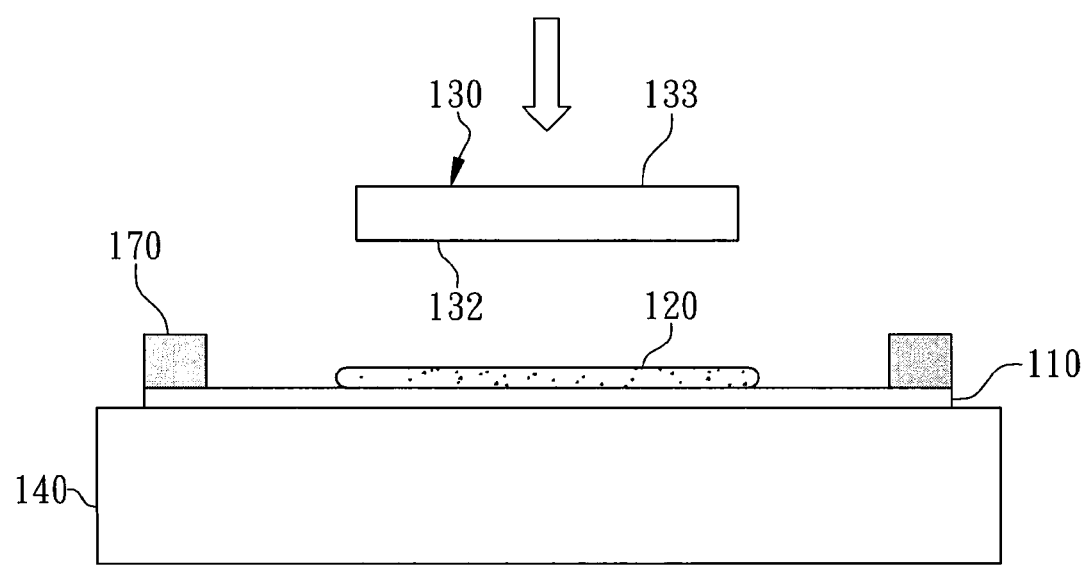
Figure 3E:
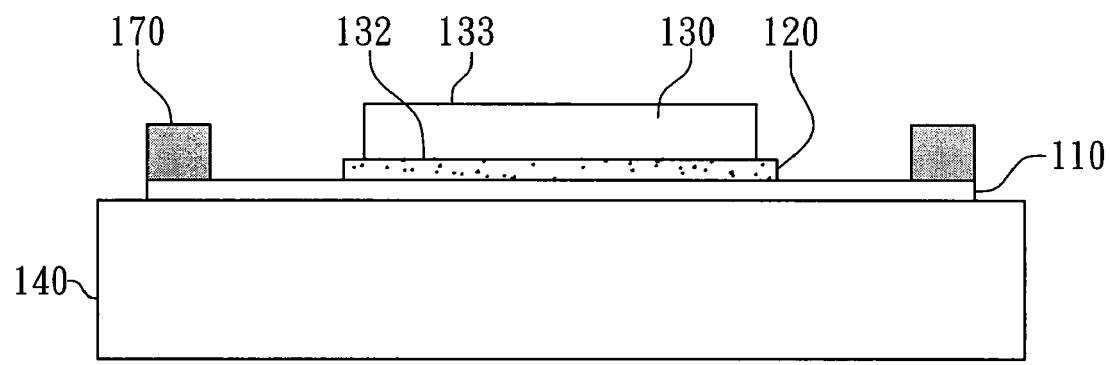

Next, step 14 is performed to attach a wafer 130 to the dielectric layer 120 on the dicing tape 110 as shown in FIGS. 3D and 3E. Therein, the wafer 130 is attached to the dielectric layer 120 by heating the dielectric layer 120 and pressing the wafer 130. In the present embodiment, the attaching surface of the wafer 130 adhered by the dielectric layer 120 can be the back surface 132 to make the dielectric layer 120 as a die-attaching adhesive. Even if the dielectric layer 120 is bleeding, the active surface 133 of the wafer 130 will not be contaminated. This resolves the conventional formation of a dielectric layer by multiple heating steps leading to wafer warpage issues, and simplifies wafer turnover time to meet the requirements of higher yields with lower cost. In another embodiment, the attaching surface of the wafer 130 for attaching the dielectric layer 120 can be the active surface 133 to make the dielectric layer 120 as a wafer-level packaging layer.

Figure 3F:
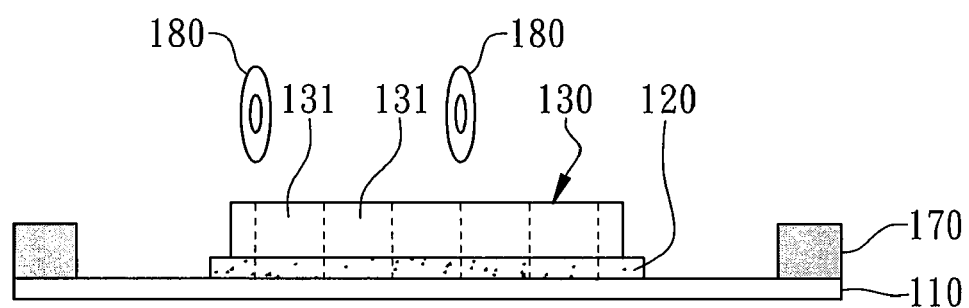
Figure 3G:
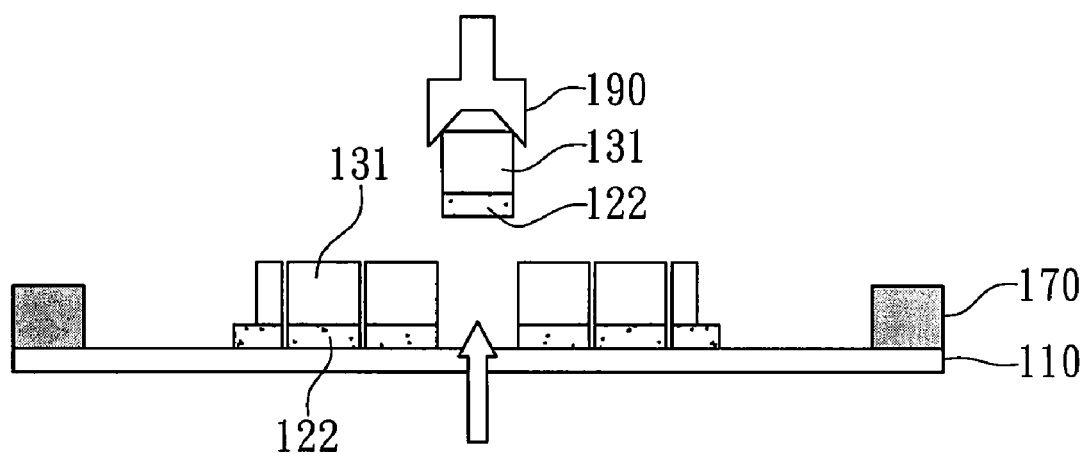

Next, step 15 is performed to dice the wafer 130 and the dielectric layer 120 as shown in FIG. 3F. A blade 180 cuts through the wafer 130 and the dielectric layer 120 to form a plurality of individual dies 131 (as shown in FIG. 3G). Each die 131 has a certain portion 122 of dielectric layer 120 attached, i.e., the cutting depth of the blade 180 exceeds the thickness of the wafer 130 and the dielectric layer 120 without cutting through the dicing tape 110. Preferably, after step 15, the adhesion of the dicing tape 110 to the diced dielectric layer 120 can be reduced or eliminated by radiating UV light.

Next, step 16 is performed to pick up the dies 131 as shown in FIG. 3G. Since the dielectric layer 120 is also diced in step 15, each die 131 is attached with a certain portion 122 of the dielectric layer 120. In step 16, the attached portions 122 of the dielectric layer 120 are peeled and separated from the dicing tape 110 when the dies 131 are picked up by a sucker 190. Furthermore, preferably, the dielectric layer 120 has the characteristic of multiple-curing stages so that the dielectric layer 120 is still adhesive after picking up the dies 131 to be a die-attaching adhesive for die attachment where the dielectric layer 120 can replace the conventional die-attaching film without extra dispensing, printing, or placing die-attaching materials to be low-cost die-attaching materials.

Figure 4A:
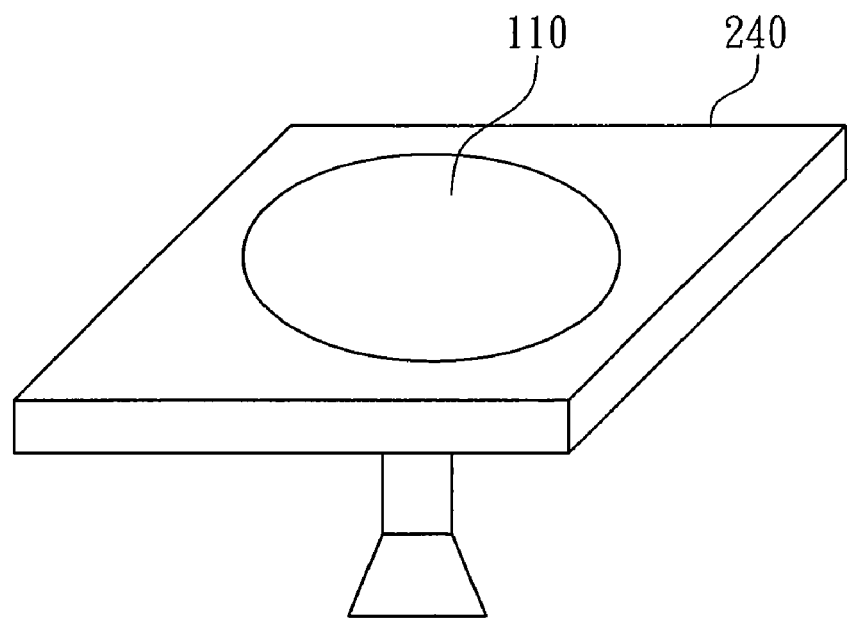
FIGS. 4A to 4G are the three-dimensional views and cross-sectional views of components in the processing steps during the method according to the second embodiment of the present invention.
Figure 4B:
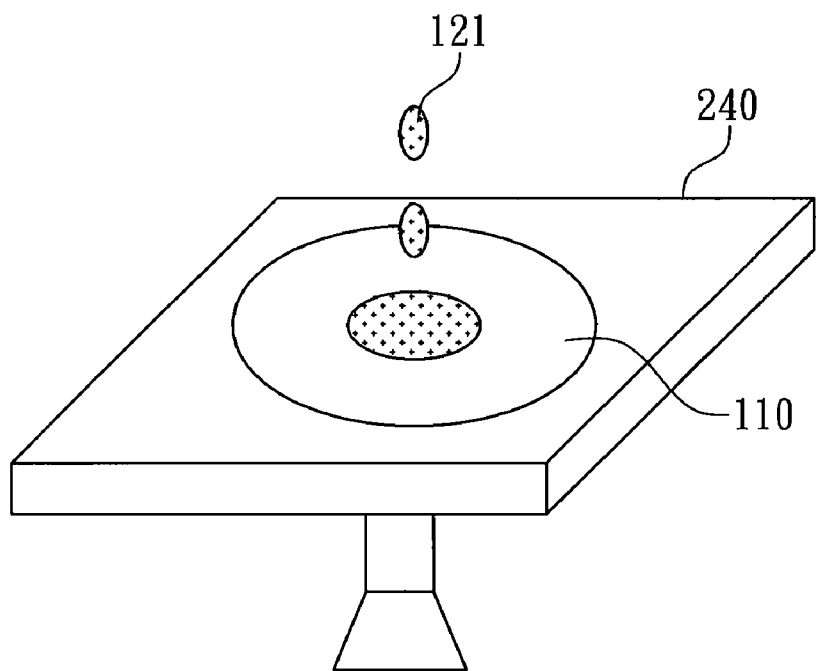
Figure 4C:
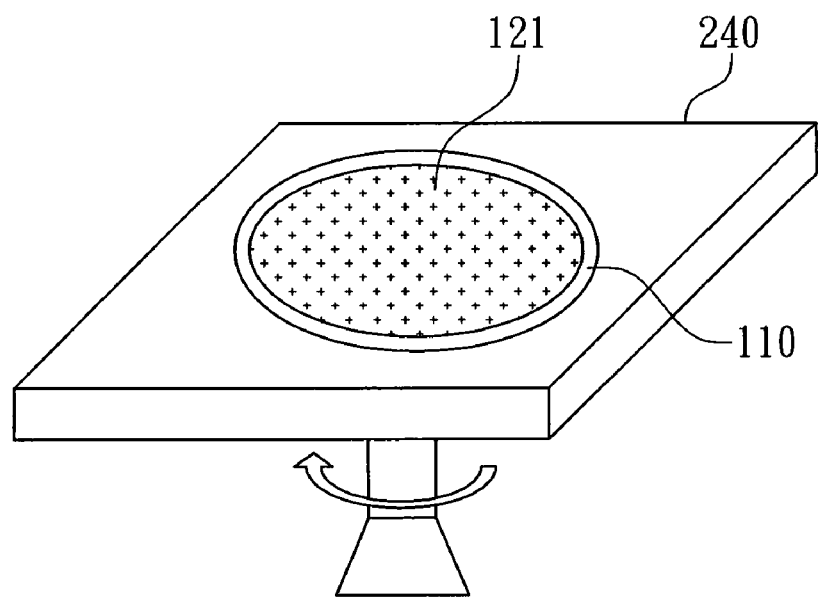
Figure 4D:
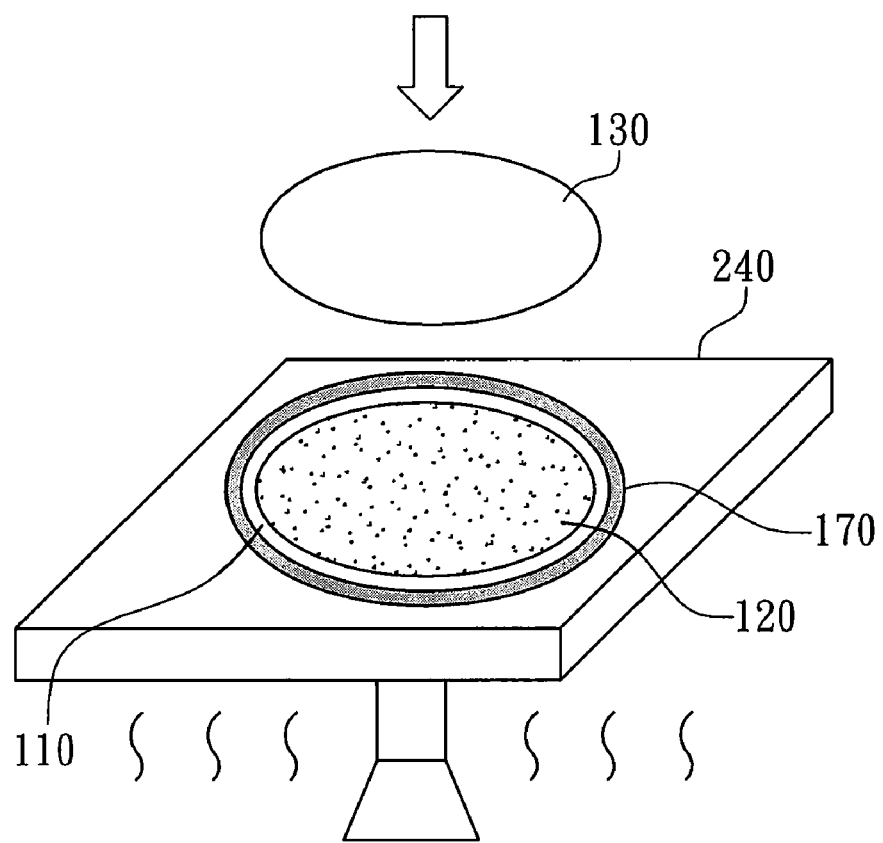
Figure 4E:
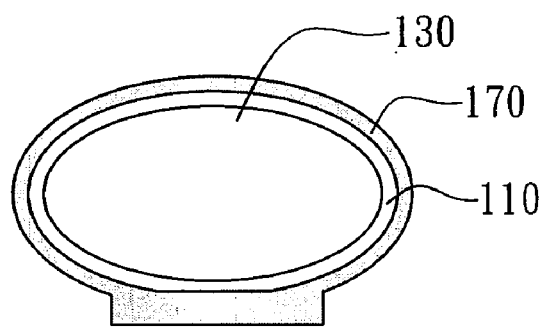
Figure 4F:
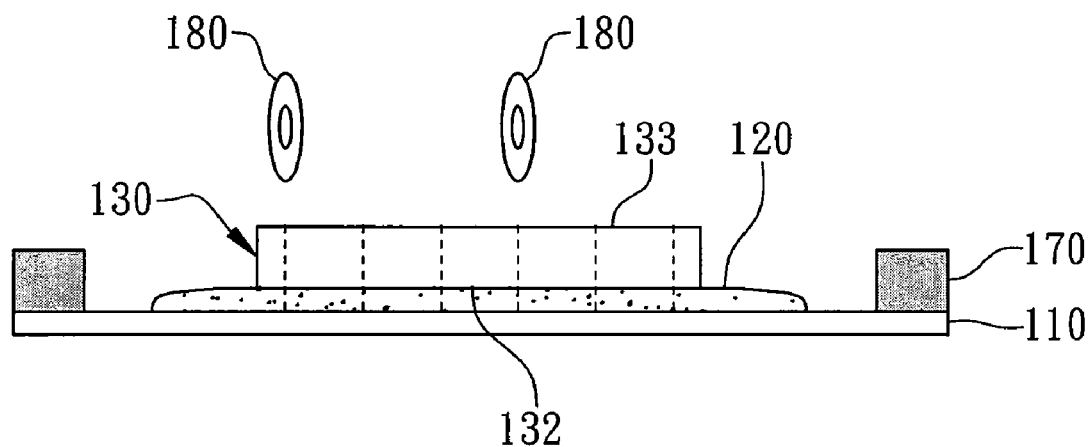
Figure 4G:
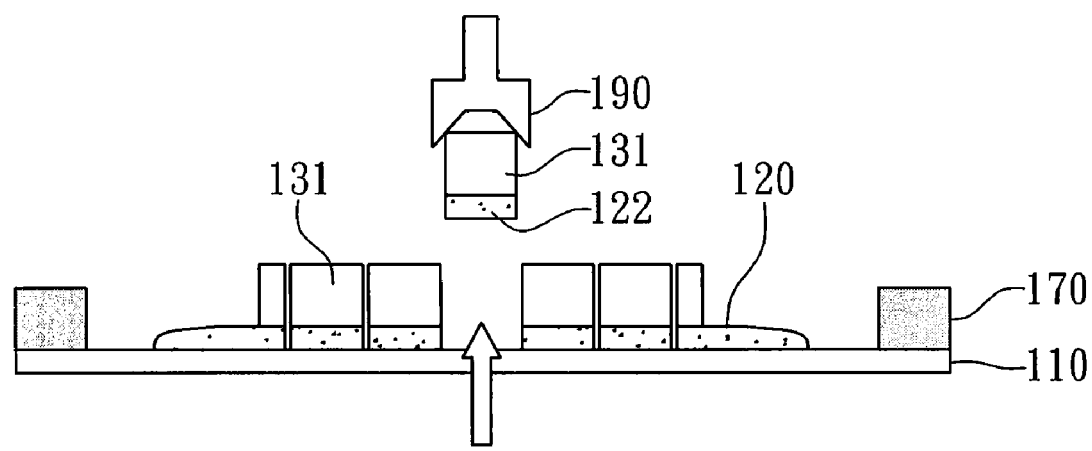
Figure 5A:
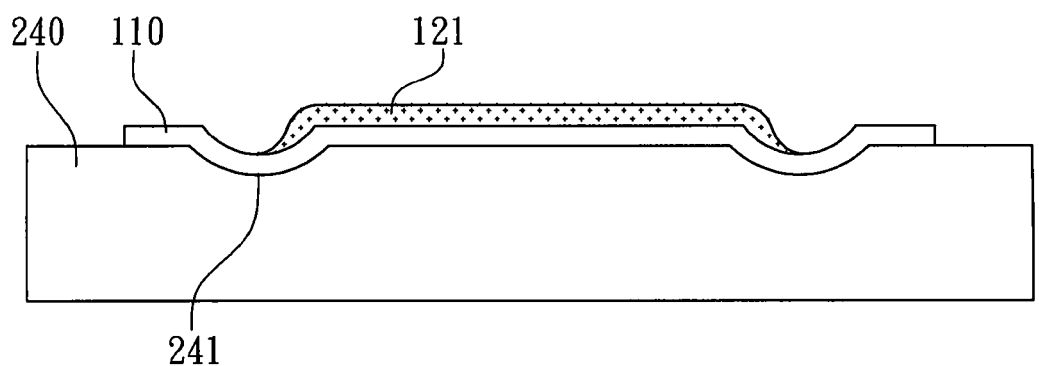
FIGS. 5A to 5C are enlarged cross-sectional views of components from the formation step of the dielectric layer to the wafer attaching step during the method according to the second embodiment of the present invention.
Figure 5B:
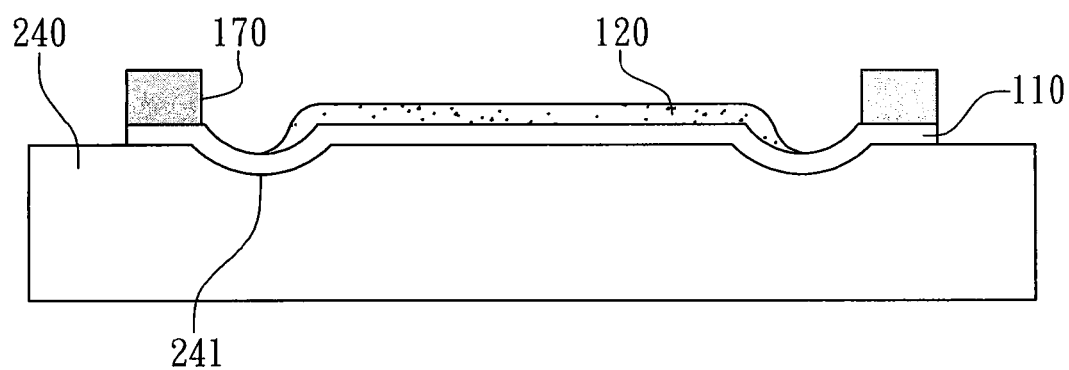
Figure 5C:
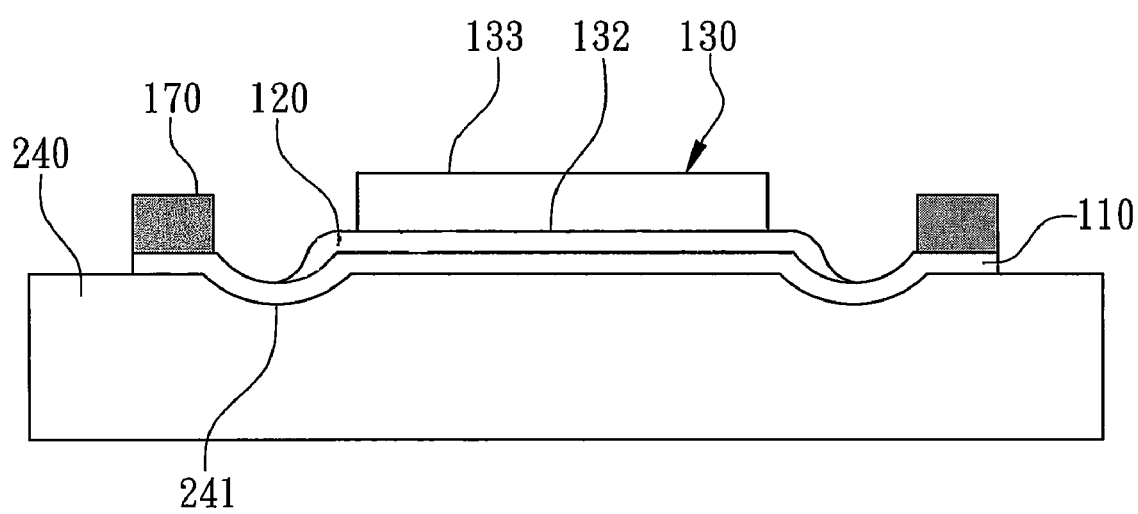

According to the second embodiment of the present invention, another method of manufacturing dies formed with a dielectric layer is illustrated from FIG. 4A to FIG. 4G for the three-dimensional views and cross-sectional views of components in the processing steps and from FIGS. 5A to 5C for enlarged cross-sectional views of components from the formation step of the dielectric layer to the wafer attaching step. The components used in the method of manufacturing dies with dielectric layer according to the present embodiment are almost the same as the ones in the first embodiment. Therefore, the same component numbers are used.

As shown in FIG. 4A, firstly in step 11, a dicing tape 110 is provided where the dicing tape 110 can be a UV blue tape. The dicing tape 110 is placed on a spin-coating stage 240 for keeping the dielectric layer 120 horizontal (as shown in FIG. 5B) in step 12. The spin-coating stage 240 can be a hot plate to heat the dielectric layer 120 to remove solvent inside in step 13 and to become more adhesive during attaching the wafer 130 (as shown in FIG. 5C) in step 14. Preferably, as shown in FIGS. 5A to 5C, the spin-coating stage 240 has an annular groove 241 so that the portions of the dicing tape 110 located on the annular groove 241 concavely deform when the dicing tape 110 is fixed by a suction force from the spin-coating stage 240.

As shown in FIG. 4D, a liquid dielectric layer 120 is formed on the dicing tape 110 where the liquid dielectric layer 120 has the characteristic of multiple-curing stages. In the present embodiment, the dielectric layer 120 can be disposed on the dicing tape 110 by spin coating where the actual operations are shown in FIGS. 4B and 4C. Drops of liquid dielectric material 121 are disposed at the center of the dicing tape 110 on the spin-coating stage 240. Simultaneously, the spin-coating stage 240 spins to spread the liquid dielectric material 121 as shown in FIG. 4C and further to form the liquid dielectric layer 120 as shown in FIG. 4D. As shown in FIG. 5A, when the excess liquid dielectric material 121 is dispensed which will bleed out during spin coating, the excess liquid dielectric material 121 may be accommodated in deformed portions of the dicing tape 110 on the annular groove 241 to avoid contaminations of the excess liquid dielectric material 121 bleeding to the peripheral area during spin coating. Then, the dielectric layer 120 is heated to be sticky, such as in B-staged or in partially cured state, as shown in FIG. 5B and FIG. 4D.

In the present embodiment, as shown in FIG. 4D and FIG. 5B, a positioning ring 170 is attached to the peripheries of the dicing tape 110 after the dropping sub-step mentioned above. Preferably, the positioning ring 170 is not in direct contact with the dielectric layer 120 by accommodation of the annular groove 241. Then, as shown in FIG. 4D and FIG. 5C, a wafer 130 is attached to the dielectric layer 120 on the dicing tape 110 by pressing to make the wafer 130 closely and smoothly attach to the dielectric layer 120 and the bleeding of the dielectric layer 120 can be accommodated by the annular groove 241, as shown in FIG. 5C. During attaching the wafer 130, the dielectric layer 120 is heated to be adhesive. As shown in FIG. 4E, the positioning ring 170 carrying with the dicing tape 110, the dielectric layer 120 and the wafer 130 can easily be released from the stage 240.

As shown in FIG. 4F, a blade 180 dices the wafer 130 and the dielectric layer 120 along the scribe lines to form a plurality of individual dies 131 (as shown in FIG. 4G). Each die 131 has certain portions 122 of the dielectric layer 120 attached (as shown in FIG. 4G). Therein, the attached surface of the wafer 130 by the dielectric layer 120 is a back surface 132 with an exposed active surface 133 facing upward. Then, the dicing tape 110 is radiated with UV light to reduce or eliminate the adhesion for easily picking up dies in the following processes. As shown in FIG. 4G, the dies 131 are picked up by a sucker 190 where the corresponding attached portions 122 diced from the dielectric layer 120 are peeled and separated from the dicing tape 110.

Therefore, according to the present invention of manufacturing dies formed with a dielectric layer, the dicing tape 110 can commonly be implemented in formation of dielectric layer 120 and in wafer dicing processes. One of the most specific functions is that when the dielectric layer 120 is formed and attached to the wafer 130, the active surface 133 of the wafer 130 is exposed facing upward to resolve wafer damages due to turning wafers for conventional wafer dicing processes as well as alignment issues due to wafer dicing from the back surface of a wafer to enhance easy processing.

The above description of embodiments of this invention is intended to be illustrative but not limited. Other embodiments of this invention will be obvious to those skilled in the art in view of the above disclosure which still will be covered by and within the scope of the present invention even with any modifications, equivalent variations, and adaptations.

What is claimed is:

1. A method of manufacturing dies formed with a dielectric layer, comprising the steps of:
   providing a dicing tape;
   forming a liquid dielectric layer on the dicing tape by spin-coating, wherein the forming step includes the steps of placing the dicing tape on a spin-coating stage, dropping the liquid dielectric material on the dicing tape on the spin-coating stage and simultaneously spinning the spin-coating stage, and attaching a positioning ring to the peripheries of the dicing tape;
   heating the liquid dielectric layer to be sticky;
   attaching a wafer to the dielectric layer on the dicing tape;
   dicing the wafer and the dielectric layer to form a plurality of dies each having a certain portion of the dielectric layer attached; and
   picking up the dies with the attached portions of the dielectric layer peeled and separated from the dicing tape.

2. The method as claimed in claim 1, wherein the dicing tape is attached to a stage for keeping the dielectric layer horizontal during the providing step of the dicing tape.

3. The method as claimed in claim 1, wherein the spin-coating stage has an annular groove located outside the wafer but inside the positioning ring.

4. The method as claimed in claim 1, wherein the dielectric layer has the characteristic of multiple-curing stages and the dielectric layer is still adhesive after the picking up step.

5. The method as claimed in claim 1, wherein the dicing tape is a UV blue tape.

6. The method as claimed in claim 1, further comprising the step of reducing the adhesion of the dicing tape after the dicing step and before the picking up step.

7. The method as claimed in claim 1, wherein the attached surface of the wafer coated with the dielectric layer is a back surface.

8. The method as claimed in claim 1, wherein the attached surface of the wafer coated the dielectric layer is an active surface.

9. The method as claimed in claim 2, wherein the stage is a hot plate to heat the dielectric layer during the wafer attaching step.

10. The method as claimed in claim 9, wherein the dielectric layer is in a partially cured state by the heating stage during the heating step of the liquid dielectric layer.

* * * * *